(12) United States Patent
Evans et al.

(10) Patent No.: US 12,167,579 B2
(45) Date of Patent: Dec. 10, 2024

(54) DEVICE TEMPERATURE ADJUSTMENT

(71) Applicant: Micron Technology, Inc., Boise, ID (US)

(72) Inventors: Tracy D. Evans, Boise, ID (US); Gloria Y. Yang, Boise, ID (US); Jiewei Chen, Meridian, ID (US); Jing Zhou, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 250 days.

(21) Appl. No.: 17/533,225

(22) Filed: Nov. 23, 2021

(65) Prior Publication Data

US 2023/0164957 A1     May 25, 2023

(51) Int. Cl.
*H05K 7/20*       (2006.01)
*G05B 15/02*      (2006.01)

(52) U.S. Cl.
CPC ......... *H05K 7/20836* (2013.01); *G05B 15/02* (2013.01); *H05K 7/20* (2013.01)

(58) Field of Classification Search
USPC ....................................................... 700/300
See application file for complete search history.

(56) References Cited

U.S. PATENT DOCUMENTS

| | | | | |
|---|---|---|---|---|
| 5,626,020 | A * | 5/1997 | Sangster | F25B 23/00 62/118 |
| 6,482,332 | B1 | 11/2002 | Malach | |
| 2017/0354190 | A1 * | 12/2017 | Cauchy | B60N 2/5635 |
| 2021/0222959 | A1 | 7/2021 | Michaud et al. | |
| 2021/0257144 | A1 | 8/2021 | Laneryd et al. | |
| 2021/0333575 | A1 | 10/2021 | Hu et al. | |
| 2021/0348315 | A1 | 11/2021 | Ashcom et al. | |
| 2022/0113605 | A1 * | 4/2022 | Rathod | G02F 1/167 |
| 2022/0262176 | A1 * | 8/2022 | Byun | H05K 7/20209 |

OTHER PUBLICATIONS

Zhang et al., "Photochemical Phase Transitions Enable Coharvesting of Photon Energy and Ambient Heat for Energetic Molecular Solar Thermal Batteries That Upgrade Thermal Energy" Journal of American Chem. Society, 2020, 142, pp. 12256-12264 (Year: 2020).*
Compagnoni et al., "Reviewing the Evolution of the nand Flash Technology" Proceedings of the IEEE, vol. 105, No. 9, Sep. 2017, pp. 1609-1633 (Year: 2017).*
Han et al., "Optically-controlled long-term storage and release of thermal energy in phase-change materials" Nature Communications vol. 8, Article No. 1446 (2017), 10 pgs (Year: 2017).*

* cited by examiner

*Primary Examiner* — Emilio J Saavedra
(74) *Attorney, Agent, or Firm* — Brooks, Cameron & Huebsch, PLLC

(57) ABSTRACT

Systems associated with device temperature adjustment are described. A device temperature adjustment system can include an electronic device having a temperature sensor integrated therein to detect a temperature of the electronic device and a temperature adjust module coupled to the electronic device to adjust a temperature of the electronic device based on the detected temperature.

15 Claims, 6 Drawing Sheets

DEVICE TEMPERATURE ADJUSTMENT

TECHNICAL FIELD

The present disclosure relates generally to apparatuses and methods associated with device temperature adjustment.

BACKGROUND

Memory resources are typically provided as internal, semiconductor, integrated circuits in computers or other electronic systems. There are many different types of memory, including volatile and non-volatile memory. Volatile memory can require power to maintain its data (e.g., host data, error data, etc.). Volatile memory can include random access memory (RAM), dynamic random-access memory (DRAM), static random-access memory (SRAM), synchronous dynamic random-access memory (SDRAM), and thyristor random access memory (TRAM), among other types. Non-volatile memory can provide persistent data by retaining stored data when not powered. Non-volatile memory can include NAND flash memory, NOR flash memory, and resistance variable memory, such as phase change random access memory (PCRAM) and resistive random-access memory (RRAM), ferroelectric random-access memory (FeRAM), and magnetoresistive random access memory (MRAM), such as spin torque transfer random access memory (STT RAM), among other types.

Electronic systems often include a number of processing resources (e.g., one or more processing resources), which may retrieve instructions from a suitable location and execute the instructions and/or store results of the executed instructions to a suitable location (e.g., the memory resources). A processing resource can include a number of functional units such as arithmetic logic unit (ALU) circuitry, floating point unit (FPU) circuitry, and a combinatorial logic block, for example, which can be used to execute instructions by performing logical operations such as AND, OR, NOT, NAND, NOR, and XOR, and invert (e.g., NOT) logical operations on data (e.g., one or more operands). For example, functional unit circuitry may be used to perform arithmetic operations such as addition, subtraction, multiplication, and division on operands via a number of operations.

DETAILED DESCRIPTION

Figure 1:
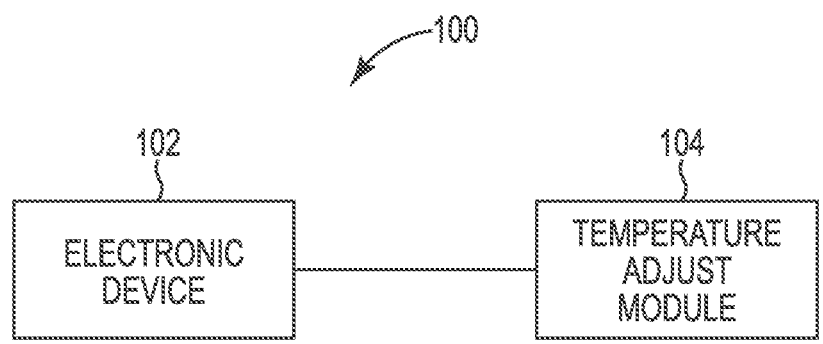
FIG. 1 is a functional diagram representing a system including an electronic device in communication with a temperature adjust module for device temperature adjustment in accordance with a number of embodiments of the present disclosure.

Apparatuses, systems, and methods related to device temperature adjustment are described. Maintenance of device performance at extreme temperatures can be challenging in electronic devices. For instance, if a temperature of the electronic device exceeds a maximum allowed working temperature, memory devices within the electronic device may overheat, leading to overall device degradation and/or loss of data. When the temperature of the electronic device approaches lower limits, memory devices can face sudden shutdown issues and/or loss of data. For instance, memory devices in mobile phones and automobile global positioning systems (GPS) using DRAM or NAND memory may experience different extreme conditions during use (e.g., desert temperatures, frozen tundra temperatures, etc.), but may be difficult to regulate or may be unreliable in the extreme condition.

For example, in a mobile device, DRAM and NAND case temperature ranges can be very large (e.g., 100 degrees Celsius or greater), causing challenges in design, cost, and performance of the mobile device. Performance, for instance, may be throttled down to reduce a temperature of the mobile device. Similar issues may arise in automobile devices, which may have even larger temperature ranges (e.g., 150 degrees Celsius or greater). Other electronic devices may introduce similar challenges.

Examples of the present disclosure can maintain a temperature of an electronic device (e.g., within a particular temperature range) through the implementation of a thermal-responsive device. For instance, a phase change material or a photochromic material may be used in the electronic device to adjust the temperature of the electronic device via an endothermic reaction, an exothermic reaction, or the use of solar energy. The adjustment can be performed automatically, for instance without user intervention, in some examples. This automatic adjustment can keep the electronic device in the particular temperature range for optimal performance. This can allow for a more particular temperature range and increased performance of the electronic device, in some examples. A narrower particular temperature range can increase design choices by reducing design requirements and shorten a development phase which can reduce a time to market.

Examples of the present disclosure may be integrated into existing memory devices (e.g., NAND, DRAM, etc.) using an existing temperature sensor of the memory device, in some examples. For instance, a NAND memory device may include a feature and/or sensor to determine an internal operating temperature, and a host may be able to configure a lower and upper operating temperature of the NAND device. This may be used by a temperature adjust module to determine when a temperature adjustment should be made. A DRAM device may also include a sensor to determine an internal operating temperature, for instance.

Examples of the present disclosure can include a system including an electronic device having a temperature sensor integrated therein to detect a temperature of the electronic device and a temperature adjust module coupled to the electronic device to adjust a temperature of the electronic device based on the detected temperature. A phase change material and/or a photochromic material can be used, for instance, to adjust the temperature of the electronic device.

In the following detailed description of the present disclosure, reference is made to the accompanying drawings that form a part hereof, and in which is shown by way of illustration how one or more embodiments of the disclosure can be practiced. These embodiments are described in sufficient detail to enable those of ordinary skill in the art to practice the embodiments of this disclosure, and it is to be understood that other embodiments can be utilized and that process, electrical, and structural changes can be made without departing from the scope of the present disclosure.

It is also to be understood that the terminology used herein is for the purpose of describing particular embodiments only and is not intended to be limiting. As used herein, the singular forms "a," "an," and "the" can include both singular and plural referents, unless the context clearly dictates otherwise. In addition, "a number of," "at least one," and "one or more" (e.g., a number of memory devices) can refer to one or more memory devices, whereas a "plurality of" is intended to refer to more than one of such things. Furthermore, the words "can" and "may" are used throughout this application in a permissive sense (i.e., having the potential to, being able to), not in a mandatory sense (i.e., must). The term "include," and derivations thereof, means "including, but not limited to." The terms "coupled," and "coupling" mean to be directly or indirectly connected physically or for access to and movement (transmission) of commands and/or data, as appropriate to the context.

The figures herein follow a numbering convention in which the first digit or digits correspond to the figure number and the remaining digits identify an element or component in the figure. Similar elements or components between different figures can be identified by the use of similar digits. For example, 104 can reference element "04" in FIG. 1, and a similar element can be referenced as 204 in FIG. 2. As will be appreciated, elements shown in the various embodiments herein can be added, exchanged, and/or eliminated so as to provide a number of additional embodiments of the present disclosure. In addition, the proportion and/or the relative scale of the elements provided in the figures is intended to illustrate certain embodiments of the present disclosure and should not be taken in a limiting sense.

FIG. 1 is a functional diagram representing a system 100 including an electronic device 102 in communication with a temperature adjust module 104 for device temperature adjustment in accordance with a number of embodiments of the present disclosure. The electronic device 102, for example, can include a DRAM device, a NAND memory device, or another electronic device such as a mobile device that includes a memory device. The temperature adjust module 104 can be an apparatus having control circuitry configured to determine whether a temperature of an associated electronic device 102 should be adjusted and/or adjust the temperature based on the determination. As used herein, an "apparatus" can refer to, but is not limited to, a variety of structures or combinations of structures, such as a circuit or circuitry, a die or one or more die, a device or devices, or a system or systems.

The electronic device 102 can have a temperature sensor integrated therein to detect a temperature of the electronic device 102 (e.g., an internal temperature of a memory device), and the temperature adjust module 104 can be coupled to the electronic device 102 to adjust a temperature of the electronic device 102 based on the detected temperature. The electronic device 102, for example, can include a PCM, and the temperature adjust module 104 can signal the PCM to adjust the temperature of the electronic device 102. The adjustment, for instance, can include the temperature adjust module 104 inducing an exothermic reaction to increase the temperature of the electronic device 102 in response to the detected temperature falling below a particular temperature range or the temperature adjust module 104 inducing an endothermic reaction to decrease the temperature of the electronic device 102 in response to the detected temperature rising above a particular temperature range. The particular temperature range, for instance, can include a stable temperature range of the PCM, an optimal working temperature range of the electronic device 102, or both.

The temperature adjust module 104 can, for instance, adjust the temperature of the electronic device 102 across an entire circuitry. The temperature of the electronic device 102 can be adjusted evenly over the electronic device 102, for example. For instance, the temperature adjust module 104 can be configured to adjust a temperature of an entire area where the circuits of the electronic device 102 are designed, not just a temperature of a portion of the device (e.g., not just a portion of the cell structure).

In some examples, the electronic device 102 can include a photochromic material, and the adjustment can include the temperature adjust module 104 using the photochromic material to adjust the temperature of the electronic device 102. For instance, the temperature adjust module 104 can be configured to use solar energy to increase a temperature of the electronic device 102 in response to the detected temperature falling below a particular temperature range and induce an endothermic reaction to decrease the temperature of the electronic device 102 in response to the detected temperature rising above the particular temperature range. In some instances, the system 100 can include a storage device to store solar energy collected by the photochromic material and used to increase the temperature of the electronic device 102.

Figure 2:
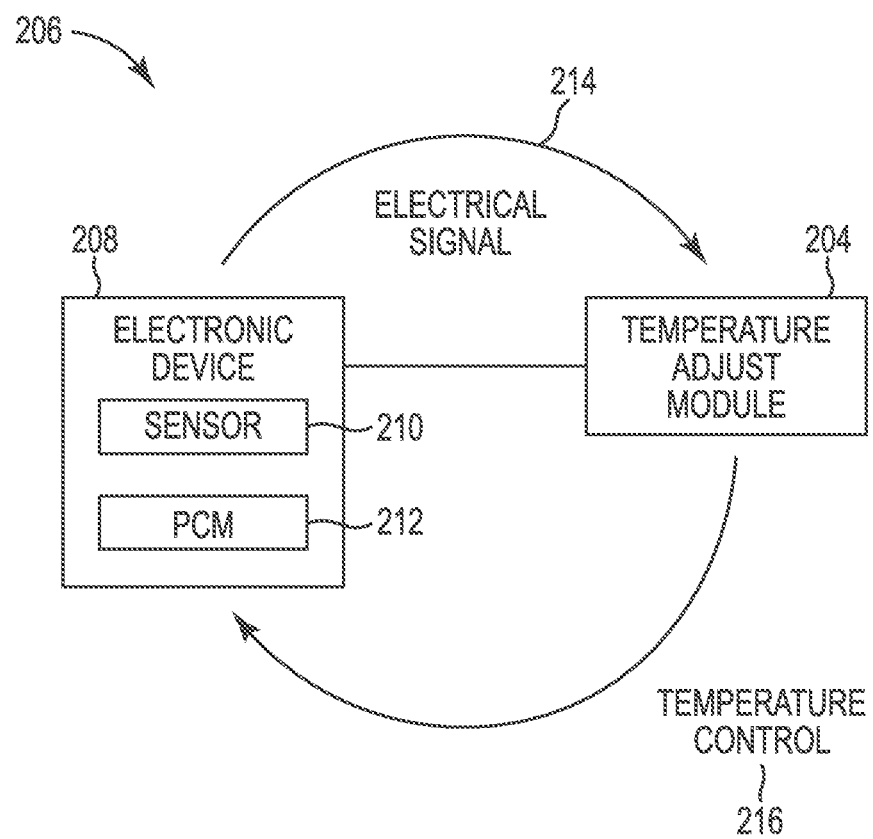
FIG. 2 is another functional diagram representing a system including an electronic device having a sensor and a phase change material (PCM) in communication with a temperature adjust module for device temperature adjustment in accordance with a number of embodiments of the present disclosure.

FIG. 2 is another functional diagram representing a system 206 including an electronic device 208 having a sensor 210 and a PCM 212 in communication with a temperature adjust module 204 for device temperature adjustment in accordance with a number of embodiments of the present disclosure. The system 206, in some examples, can be analogous to the system 100 described with respect to FIG. 1.

The system 206 can include the electronic device 208 having the temperature sensor 210 integrated therein to detect a temperature of the electronic device 208. The temperature sensor 210 may be an existing temperature sensor 210 of the electronic device 208 or a newly integrated temperature sensor 210. The PCM 212 can be integrated into the electronic device. The temperature adjust module 204 can be in communication with the electronic device 208 and can raise the temperature of the electronic device 208 using the PCM 212 in response to the temperature detected by the temperature sensor 210 falling below a particular temperature range. For instance, the PCM 212 can release heat to the electronic device 208 via an exothermic reaction responsive to the temperature falling below the particular temperature range. This can reduce the risk of a sudden shutdown or loss of data, for instance, due to the electronic device 208 reaching a lower temperature limit.

The temperature adjust module 204 can lower the temperature of the electronic device 208 using the PCM 212 in response to the temperature detected by the temperature sensor 210 rising above a particular temperature range. For instance, the PCM 212 can absorb heat from the electronic device 208 via an endothermic reaction responsive to the temperature rising above the particular temperature range.

This can reduce the risk of loss of data or degradation of the electronic device 208, for instance, due to the electronic device 208 reaching a higher temperature limit. The temperature adjust module 204, in some examples, can maintain the temperature (e.g., induce neither an endothermic reaction nor an exothermic reaction) in response to the temperature detected by the temperature sensor 210 being within the particular temperature range.

Put another way, the temperature sensor 210 may detect a temperature inside or outside of the particular optimal operating temperature for the electronic device 208. An electrical signal 214 can be sent to the temperature adjust module 204, which can determine whether the temperature of the electronic device 208 should be lowered, raised, or maintained. Based on the determination, a temperature control signal 216 can be sent to the electronic device 208, the PCM 212, or both, to adjust (e.g., induce the endothermic reaction or the exothermic reaction) or maintain the temperature of the electronic device 208. In some instances, the temperature adjust module 204 may be integrated into the electronic device 208.

The electronic device 208, in some examples, may be a NAND memory device or a different electronic device having a NAND memory device therein. The temperature sensor 210 can be integrated into the NAND memory device. In other examples, the electronic device 208 may be a DRAM device or a different electronic device having a DRAM device therein. The temperature sensor 210 can be integrated into the DRAM device.

While a PCM 212 is described with respect to FIG. 2, in some examples, the electronic device may alternatively or additionally include a photochromic or other material to raise or lower the temperature of the electronic device, as will be described further herein with respect to FIG. 5.

Figure 3:
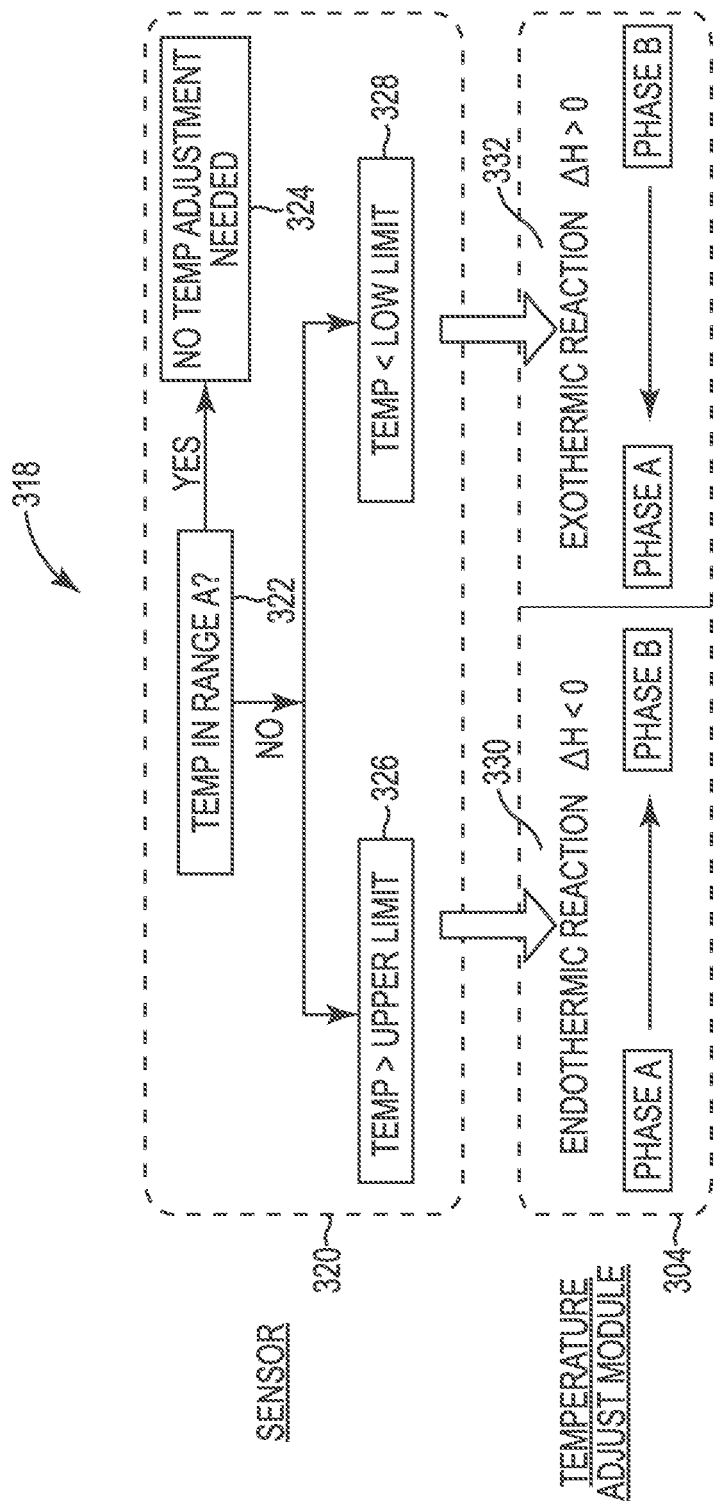
FIG. 3 is a flow diagram representing an example method for device temperature adjustment in accordance with a number of embodiments of the present disclosure.

FIG. 3 is a flow diagram 318 representing an example method for device temperature adjustment in accordance with a number of embodiments of the present disclosure. The flow diagram 318 illustrates a sensor 320 integrated into an electronic device and in communication with a temperature adjust module 304. The sensor 320 and the temperature adjust module 304 may be analogous to the sensor 210 and the temperature adjust modules 104, 204 as illustrated in FIGS. 1 and 2.

At 322, the method includes the sensor 320 determining if the electronic device (e.g., an internal temperature) is within a particular temperature range (e.g., "Range A"). This temperature range may represent an optimal performance range (e.g., best working condition range) for the electronic device. If the sensor 320 determines the electronic device is within the particular temperature range, no adjustment to the temperature of the electronic device is made, as illustrated at 324. However, if it is determined that the electronic device is outside of the particular temperature range, a determination is made (e.g., the sensor indicates) whether the determined temperature is above the upper limit of the particular temperature range at 326 or whether the determined temperature is below the lower limit of the particular temperature range at 328.

If it is determined that the determined temperature is above the upper limit of the particular temperature range at 326, the method continues to the temperature adjust module 304 inducing an endothermic reaction at 330 to lower the temperature of the electronic device by absorbing heat from the electronic device. The temperature adjust module 304 can induce the endothermic reaction, for instance, by sending an electrical signal to a PCM on the electrical device to trigger a phase change, for instance from "Phase A" to "Phase B".

If it is determined that the determined temperature is below the lower limit of the particular temperature range at 328, the method continues to the temperature adjust module 304 inducing an exothermic reaction at 332 to raise the temperature of the electronic device by releasing heat to the electronic device. The temperature adjust module 304 can induce the exothermic reaction, for instance, by sending an electrical signal to the PCM on the electrical device to trigger a phase change, for instance from "Phase B" to "Phase A". The phase change enthalpy from Phase A to Phase B can be ΔH, with an endothermic reaction occurring when ΔH<0, and an exothermic reaction occurring when ΔH>0.

Figure 4:
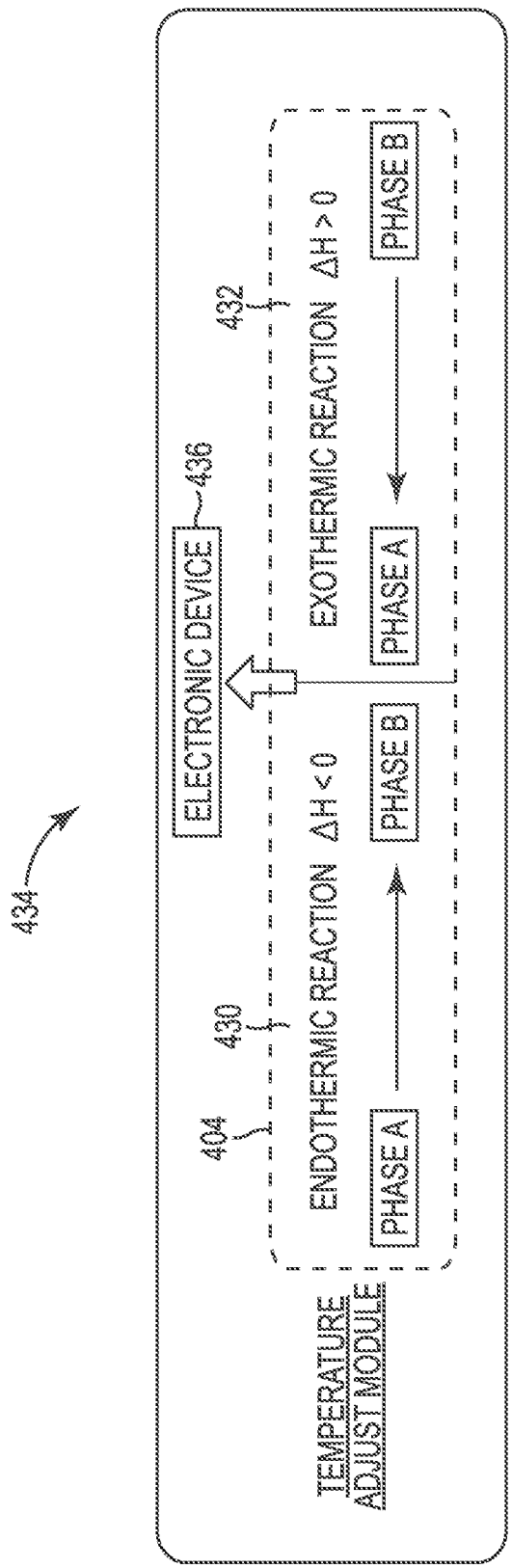
FIG. 4 is another flow diagram representing an example method for device temperature adjustment in accordance with a number of embodiments of the present disclosure.

FIG. 4 is another flow diagram 434 representing an example method for device temperature adjustment in accordance with a number of embodiments of the present disclosure. The flow diagram 434 illustrates an electronic device 436 in communication with a temperature adjust module 404. The electronic device 436 and the temperature adjust module 404 may be analogous to the electronic devices 102, 208 and the temperature adjust modules 104, 204, 304. as illustrated in FIGS. 1, 2, and 3.

The method includes the electronic device 404 having a PCM integrated therein, and the temperature adjust module 404 integrated into a system with the electronic device 436. The PCM can be integrated into the device and may remain stable within a particular temperature range. In the example illustrated in FIG. 4, no temperature sensor is present. The method includes the temperature adjust module 404 itself sensing a temperature of the electronic device 436 and introducing a phase change based on the determined temperature.

For instance, the temperature adjust module 430 can sense a temperature of the electronic device 436 and induce an endothermic reaction 430 in the PCM to decrease the temperature of the electronic device 436 in response to the sensed temperature rising above a particular temperature range. The endothermic reaction 430 can be induced by a first applied signal causing the PCM to change from a first state to a second state (e.g., Phase A to Phase B).

The temperature adjust module 430 can sense a temperature of the electronic device 436 and induce an exothermic reaction 432 in the PCM to increase the temperature of the electronic device 436 in response to the sensed temperature falling below a particular temperature range. The exothermic reaction 432 can be induced by a second applied signal causing the phase change material to change from the second state to the first state (e.g., Phase B to Phase A). The temperature adjust module 430 can maintain the temperature (e.g., induce neither the endothermic reaction 430 nor the exothermic reaction 432) in response to the sensed temperature being within the particular temperature range.

Figure 5:
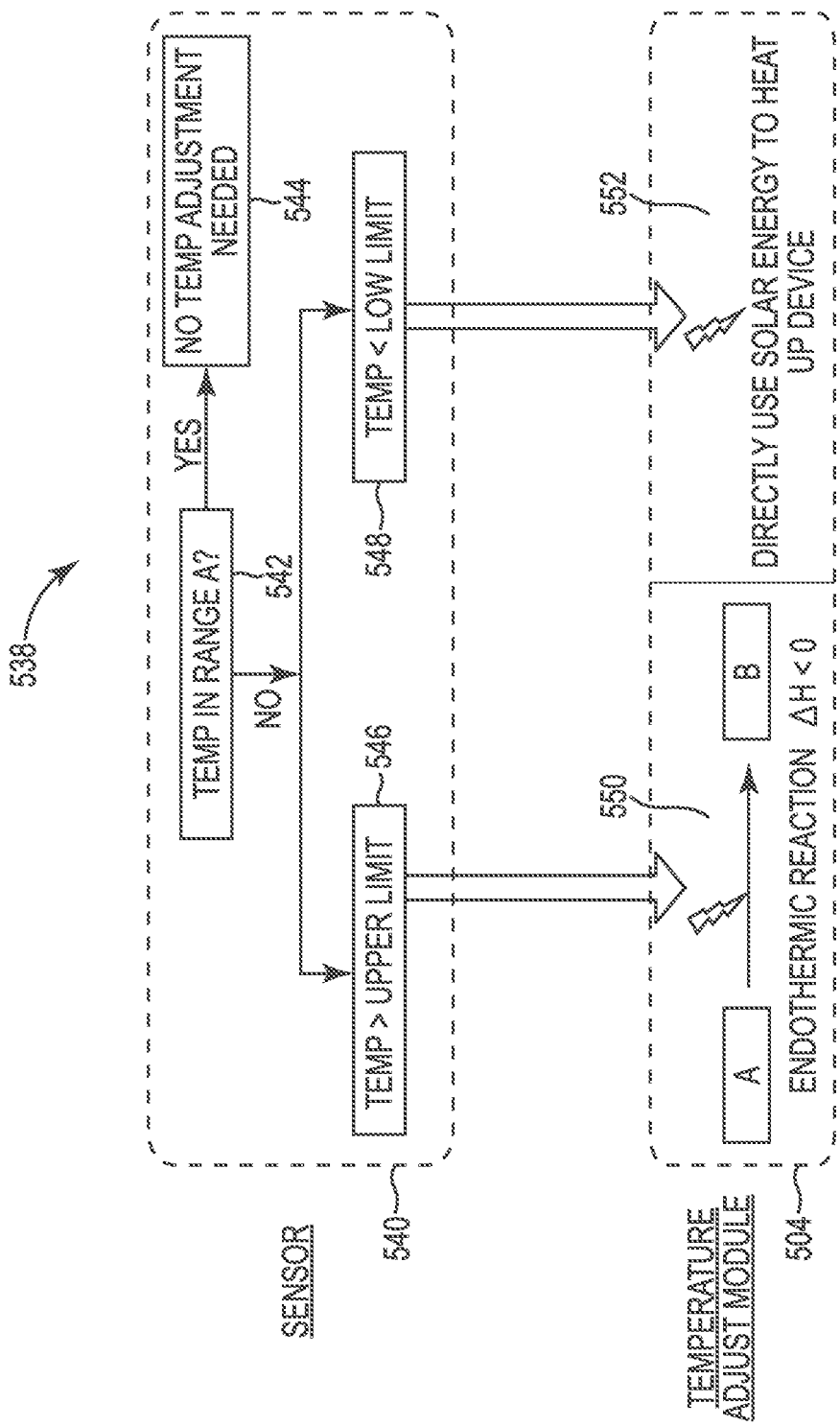
FIG. 5 is yet another flow diagram representing an example method for device temperature adjustment in accordance with a number of embodiments of the present disclosure.

FIG. 5 is yet another flow diagram 538 representing an example method for device temperature adjustment in accordance with a number of embodiments of the present disclosure. The flow diagram 538 illustrates a sensor 540 integrated into an electronic device and in communication with a temperature adjust module 504. The sensor 540 and the temperature adjust module 504 may be analogous to the sensor 210, 320 and the temperature adjust modules 104, 204, 304, 4040 as illustrated in FIGS. 1-4.

At 542, the method includes the sensor 540 determining if the electronic device (e.g., an internal temperature) is within a particular temperature range (e.g., "Range A"). This temperature range may represent an optimal performance range (e.g., best working condition range) for the electronic device. If the sensor 540 determines the electronic device is within the range, no adjustment to the temperature of the electronic device is made, as illustrated at 544. However, if it is determined that the electronic device is outside of the particular temperature range, a determination is made (e.g., the sensor indicates) whether the determined temperature is above the upper limit of the particular temperature range at 546 or whether the determined temperature is below the lower limit of the particular temperature range at 548.

If the determined temperature is above the upper limit of the particular temperature range at 546, the method continues to the temperature adjust module 504 inducing an endothermic reaction at 550 to lower the temperature of the electronic device by absorbing heat from the electronic device. The temperature adjust module 304 can induce the endothermic reaction, for instance, by sending an electrical signal to a photochromic material on the electrical device to trigger a state change, for instance from state "A" to state "B". The endothermic reaction, for instance, can be triggered by photonics.

If the determined temperature is below the lower limit of the particular temperature range at 548, the method continues to the temperature adjust module 504 directly using solar energy to heat up the electronic device at 552. The electronic device's temperature can be raised at 552 by releasing heat to the electronic device using solar energy collected by the photochromic material. In some examples, the system including the sensor 540 and/or the temperature adjust module 504 can include a storage device to store solar energy collected by the photochromic material and used to increase the temperature of the electronic device. The state change enthalpy of the photochromic material from state A to state B can be $\Delta H$, with an endothermic reaction occurring when $\Delta H < 0$, and solar energy being used to heat the electronic device when $\Delta H > 0$. A phase or state change may not occur when heating the electronic device because of the direct use of solar energy.

Figure 6:
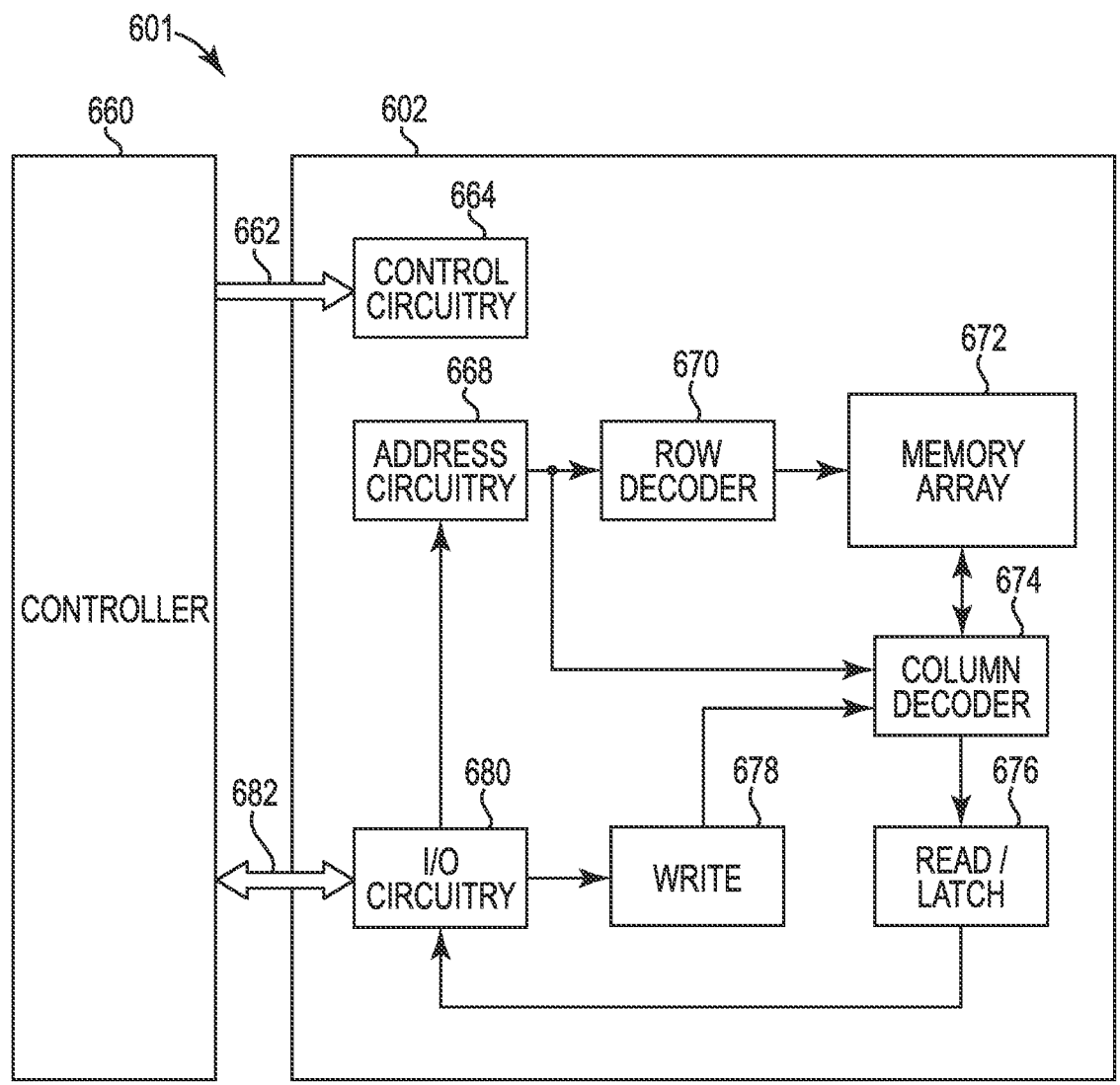
FIG. 6 is a block diagram illustration of an example apparatus in accordance with a number of embodiments of the present disclosure.

FIG. 6 is a block diagram illustration of an example apparatus, such as an electronic memory system 601 in accordance with a number of embodiments of the present disclosure. Memory system 601 includes an apparatus, such as a memory device (e.g., electronic device) 602, and a controller 660, such as a memory controller (e.g., a host controller). Controller 660 might include a processor, for example. Controller 660 might be coupled to a host, for example, and may receive command signals (or commands), address signals (or addresses), and data signals (or data) from the host and may output data to the host.

Memory device 602 includes a memory array 672 of memory cells. For example, memory array 672 may include one or more of the memory arrays of memory cells disclosed herein.

Memory device 602 includes address circuitry 668 to latch address signals provided over I/O connections 682 through I/O circuitry 680. Address signals are received and decoded by a row decoder 670 and a column decoder 674 to access the memory array 672. For example, row decoder 670 and/or column decoder 674 may include drivers.

Memory device 602 may sense (e.g., read) data in memory array 672 by sensing voltage and/or current changes in the memory array columns using sense/buffer circuitry that in some examples may be read/latch circuitry 676. Read/latch circuitry 676 may read and latch data from the memory array 672. I/O circuitry 680 is included for bi-directional data communication over the I/O connections 682 with controller 660. Write circuitry 678 is included to write data to memory array 672.

Control circuitry 664 may decode signals provided by control connections 662 from controller 660. These signals may include chip signals, write enable signals, and address latch signals that are used to control the operations on memory array 672, including data read and data write operations.

Control circuitry 664 may be included in controller 660, for example. Controller 660 may include other circuitry, firmware, software, or the like, whether alone or in combination. Controller 660 may be an external controller (e.g., in a separate die from the memory array 672, whether wholly or in part) or an internal controller (e.g., included in a same die as the memory array 672). For example, an internal controller might be a state machine or a memory sequencer. In some examples, controller 660 may be configured to cause memory device 602 and/or a temperature adjust module to at least perform methods disclosed herein.

As used herein, the term "coupled" may include electrically coupled, directly coupled, and/or directly connected with no intervening elements (e.g., by direct physical contact) or indirectly coupled and/or connected with intervening elements. The term coupled may further include two or more elements that co-operate or interact with each other (e.g., as in a cause-and-effect relationship).

It will be appreciated by those skilled in the art that additional circuitry and signals can be provided, and that the memory system 601 of FIG. 6 has been simplified. It should be recognized that the functionality of the various block components described with reference to FIG. 6 may not necessarily be segregated to distinct components or component portions of an integrated circuit device. For example, a single component or component portion of an integrated circuit device could be adapted to perform the functionality of more than one block component of FIG. 6. Alternatively, one or more components or component portions of an integrated circuit device could be combined to perform the functionality of a single block component of FIG. 6.

Although specific embodiments have been illustrated and described herein, those of ordinary skill in the art will appreciate that an arrangement calculated to achieve the same results can be substituted for the specific embodiments shown. This disclosure is intended to cover adaptations or variations of one or more embodiments of the present disclosure. It is to be understood that the above description has been made in an illustrative fashion, and not a restrictive one. Combination of the above embodiments, and other embodiments not specifically described herein will be apparent to those of skill in the art upon reviewing the above description. The scope of the one or more embodiments of the present disclosure includes other applications in which the above structures and processes are used. Therefore, the scope of one or more embodiments of the present disclosure should be determined with reference to the appended claims, along with the full range of equivalents to which such claims are entitled.

In the foregoing Detailed Description, some features are grouped together in a single embodiment for the purpose of streamlining the disclosure. This method of disclosure is not to be interpreted as reflecting an intention that the disclosed embodiments of the present disclosure have to use more features than are expressly recited in each claim. Rather, as the following claims reflect, inventive subject matter lies in less than all features of a single disclosed embodiment.

Thus, the following claims are hereby incorporated into the Detailed Description, with each claim standing on its own as a separate embodiment.

What is claimed is:

1. A system, comprising:
an electronic device having a phase change material (PCM) integrated therein, a photochromic material integrated therein, and a temperature sensor integrated therein to detect a temperature of the electronic device; and
a temperature adjust module coupled to the electronic device to adjust a temperature of the electronic device based on the detected temperature such that:
in response to a determination that the detected temperature is above an upper limit of a particular temperature range, the temperature adjust module is configured to induce an endothermic reaction in the PCM and in the photochromic material by sending an electrical signal to the photochromic material to trigger a state change and the PCM to trigger a first phase change from a first phase to a second phase
in response to a determination that the detected temperature is below a lower limit of the particular temperature range, the temperature adjust module is configured to induce an exothermic reaction in the PCM and in the photochromic material with solar energy, the PCM to trigger a second phase change from the second phase to the first phase; and
maintain the temperature in response to the detected temperature being within the particular temperature range.

2. The system of claim 1, wherein the temperature sensor sends an electrical signal to the temperature adjust module when the detected temperature is outside of a particular temperature range.

3. The system of claim 1, wherein the electronic device comprises at least one of a dynamic random-access memory (DRAM) device or a NAND memory device.

4. The system of claim 1, wherein the temperature adjust module is to adjust the temperature of the electronic device across an entire circuitry of the electronic device.

5. The system of claim 1, further comprising a storage device to store the solar energy collected by the photochromic material and used to increase the temperature of the electronic device.

6. A system, comprising:
an electronic device, comprising:
a temperature sensor integrated therein to detect a temperature of the electronic device;
a photochromic material; and
a phase change material; and
a temperature adjust module to:
induce an exothermic reaction in the phase change material and in the photochromic material to raise the temperature of the electronic device by triggering heating of the electronic device with solar energy in response to the temperature detected by the temperature sensor falling below a particular temperature range;
induce an endothermic reaction in the phase change material and in the photochromic material to lower the temperature of the electronic device by triggering a different phase change in the phase change material and a state change in the photochromic material in response to the temperature detected by the temperature sensor rising above a particular temperature range; and
maintain the temperature in response to the temperature detected by the temperature sensor being within the particular temperature range.

7. The system of claim 6, wherein the phase change material, the photochromic material, or both, absorbs heat from the electronic device via the endothermic reaction responsive to the temperature detected by the temperature sensor rising above a particular temperature range.

8. The system of claim 6, wherein the phase change material releases heat via the exothermic reaction to the electronic device responsive to the temperature detected by the temperature sensor falling below a particular temperature range.

9. The system of claim 6, wherein the electronic device is a dynamic random-access memory (DRAM) device, and the temperature sensor is a temperature sensor integrated into the DRAM device.

10. The system of claim 6, wherein the electronic device is a NAND device, and the temperature sensor is a temperature sensor integrated into the NAND device.

11. The system of claim 6, wherein the temperature adjust module is integrated into the electronic device.

12. A system, comprising:
an electronic device having a phase change material and a photochromic material integrated therein; and
a temperature adjust module configured to:
sense a temperature of the electronic device;
induce an endothermic reaction in the phase change material and in the photochromic material to decrease the temperature of the electronic device in response to the sensed temperature rising above a particular temperature range;
induce an exothermic reaction in the phase change material and trigger heating of the electronic device with solar energy to increase the temperature of the electronic device in response to the sensed temperature falling below a particular temperature range; and
maintain the temperature in response to the sensed temperature being within the particular temperature range.

13. The system of claim 12, wherein the particular temperature range comprises:
a stable temperature range of the phase change material;
an optimal working temperature range of the electronic device; or
both.

14. The system of claim 12, wherein the temperature adjust module is configured to send a signal to the electronic device, the phase change material, the photochromic material, or any combination thereof, to induce the endothermic reaction or the exothermic reaction.

15. The system of claim 12, wherein:
the endothermic reaction is induced by a first applied signal causing the phase change material to change from a first state to a second state; and
the exothermic reaction is induced by a second applied signal causing the phase change material to change from the second state to the first state.

* * * * *